United States Patent
Kobayashi et al.

(10) Patent No.: US 8,456,014 B2
(45) Date of Patent: Jun. 4, 2013

(54) SEMICONDUCTOR DEVICE

(75) Inventors: Hirotaka Kobayashi, Tokyo (JP);
Kentaro Akiyama, Kanagawa (JP);
Naoki Matsushita, Kanagawa (JP);
Takayuki Ezaki, Kanagawa (JP)

(73) Assignee: Sony Corporation (JP)

( * ) Notice: Subject to any disclaimer, the term of this patent is extended or adjusted under 35 U.S.C. 154(b) by 524 days.

(21) Appl. No.: 12/604,489

(22) Filed: Oct. 23, 2009

(65) Prior Publication Data

US 2010/0109006 A1    May 6, 2010

(30) Foreign Application Priority Data

Oct. 30, 2008    (JP) .................................. 2008-279473

(51) Int. Cl.
*H01L 23/522*    (2006.01)
(52) U.S. Cl.
USPC ...................... 257/774; 257/48; 257/E23.142
(58) Field of Classification Search
USPC ................................................. 257/774, 753
IPC ........... H01L 27/14,21/60, 23/48, 21/88, 29/44,
H01L 27/148, 27/146; H04N 5/335; B05D
5/12; B32B 3/01
See application file for complete search history.

(56) References Cited

U.S. PATENT DOCUMENTS 6,940,160 B1 * 9/2005 Hanaoka et al. .............. 257/692

FOREIGN PATENT DOCUMENTS

| JP | 61-002351 | | 1/1986 |
| JP | 04-188739 | | 7/1992 |
| JP | 04-196442 | | 7/1992 |
| JP | 05-09509 | | 4/1993 |
| JP | 10-074787 | | 3/1998 |
| JP | 2005-209677 | | 8/2005 |
| JP | 2005209677 | * | 8/2005 |
| JP | 2005-285814 | | 10/2005 |
| JP | 2008-258201 | | 10/2008 |

OTHER PUBLICATIONS

Japanese Patent Office Action corresponding to Japanese Serial No. 2008-279573 dated Sep. 14, 2010.

* cited by examiner

*Primary Examiner* — Jarrett Stark
*Assistant Examiner* — Lawrence Tynes, Jr.
(74) *Attorney, Agent, or Firm* — Sheridan Ross P.C.

(57) ABSTRACT

A semiconductor device includes a semiconductor device layer, a multilayered wiring section formed of a plurality of wiring layers and a plurality of interlayer insulating films on one surface of the semiconductor device layer, an external connection electrode formed on one of the plurality of wiring layers, and an opening formed in a concave shape extending from the semiconductor device layer to the multilayered wiring section so as to expose a surface of the external connection electrode; the opening has a larger opening diameter at an end farther from the external connection electrode than at the other end closer to the external connection electrode.

6 Claims, 19 Drawing Sheets

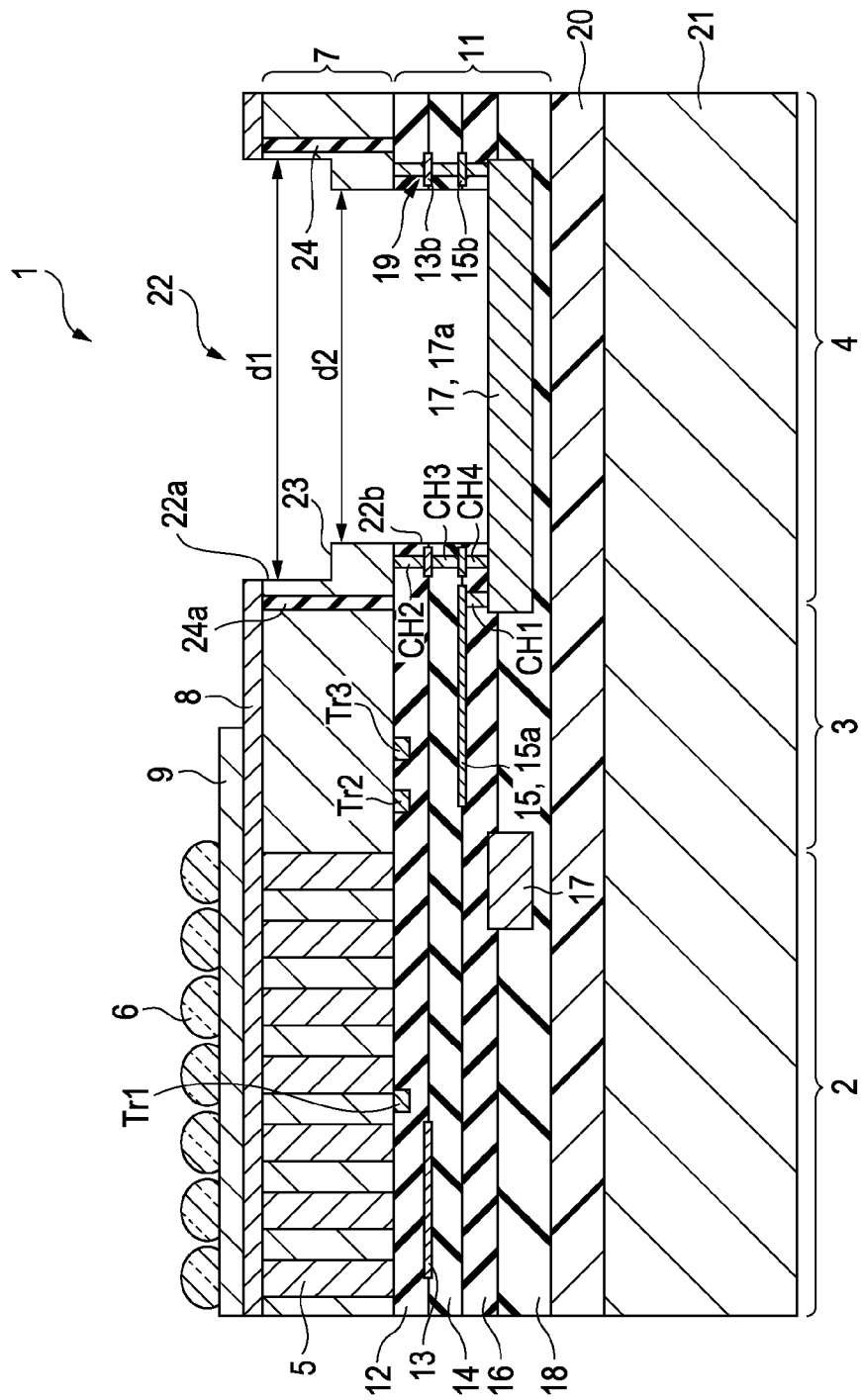

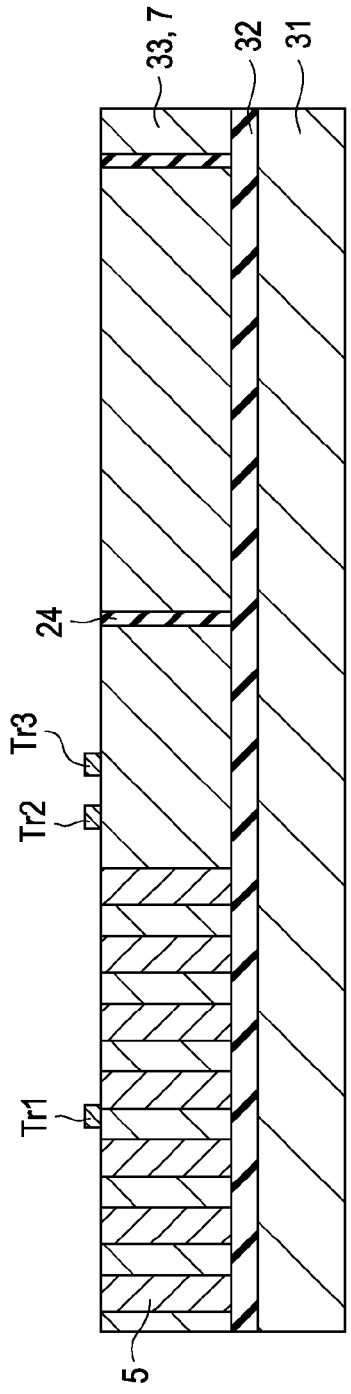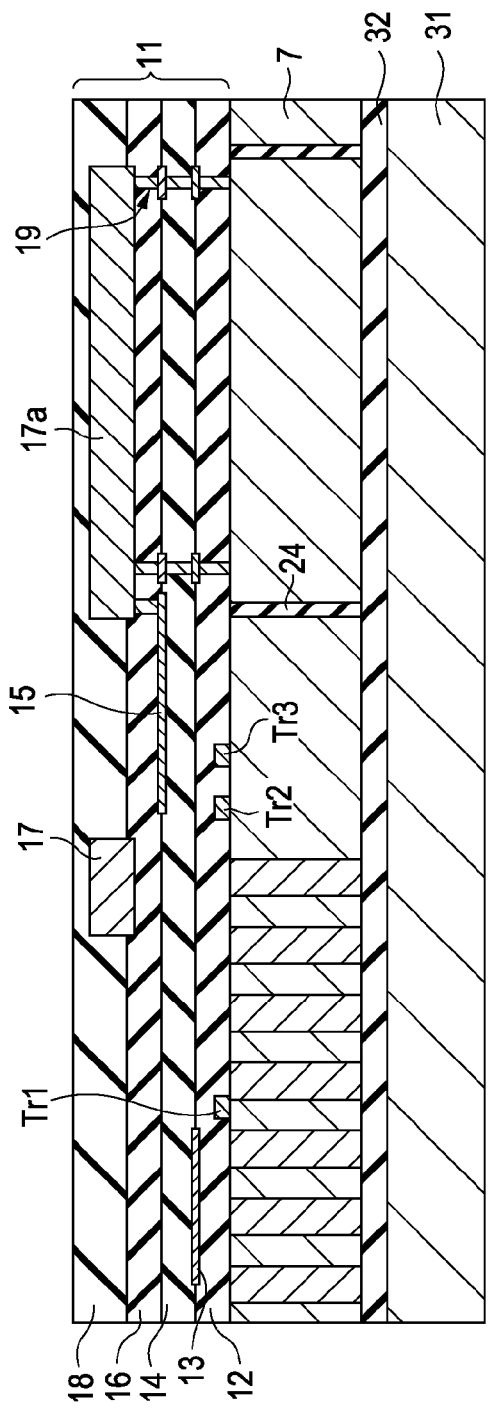

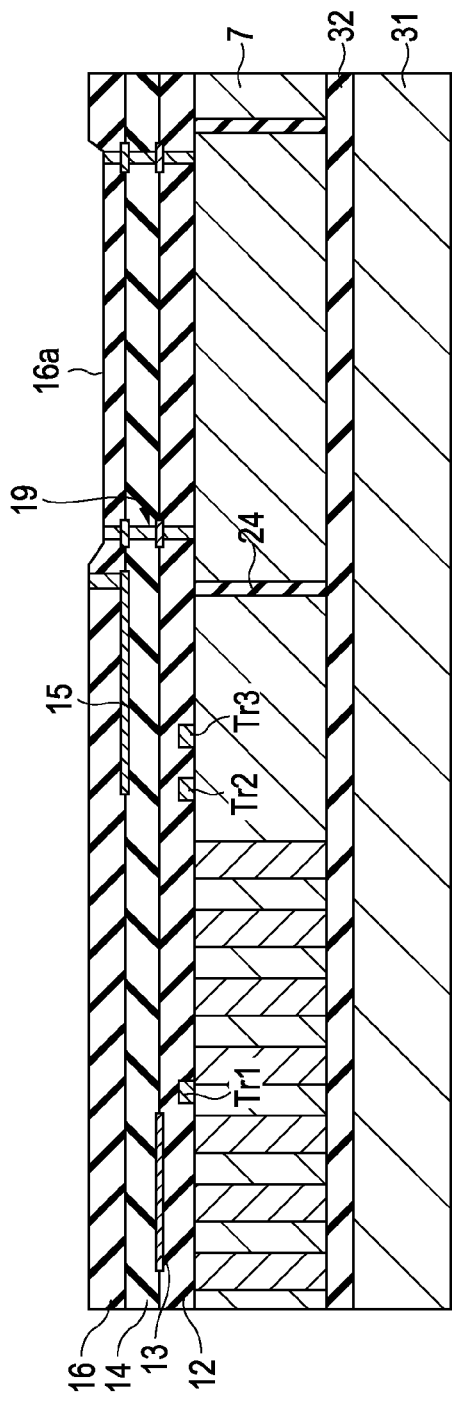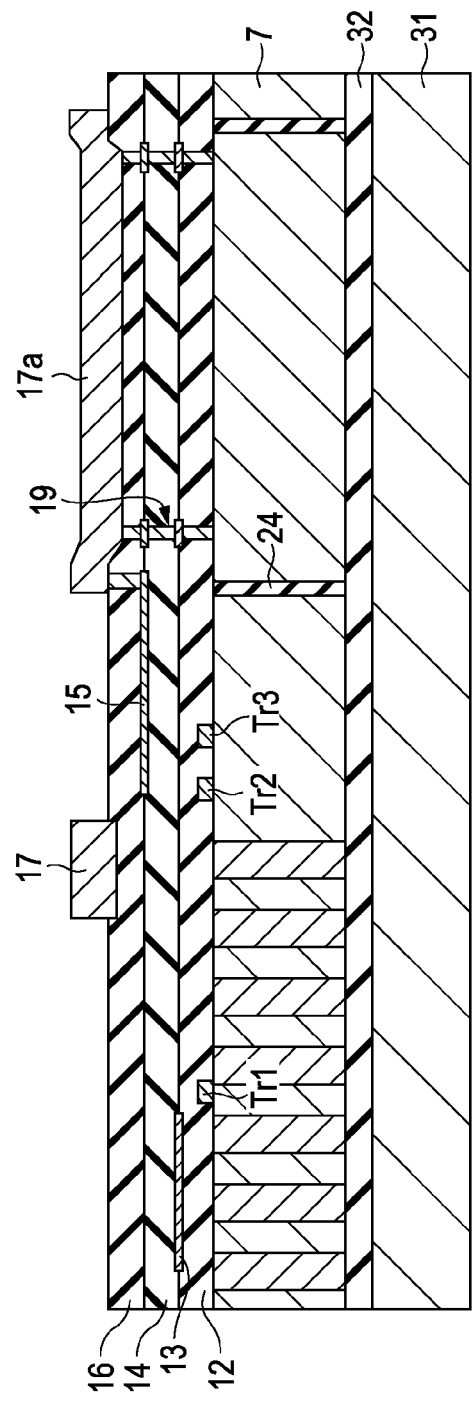

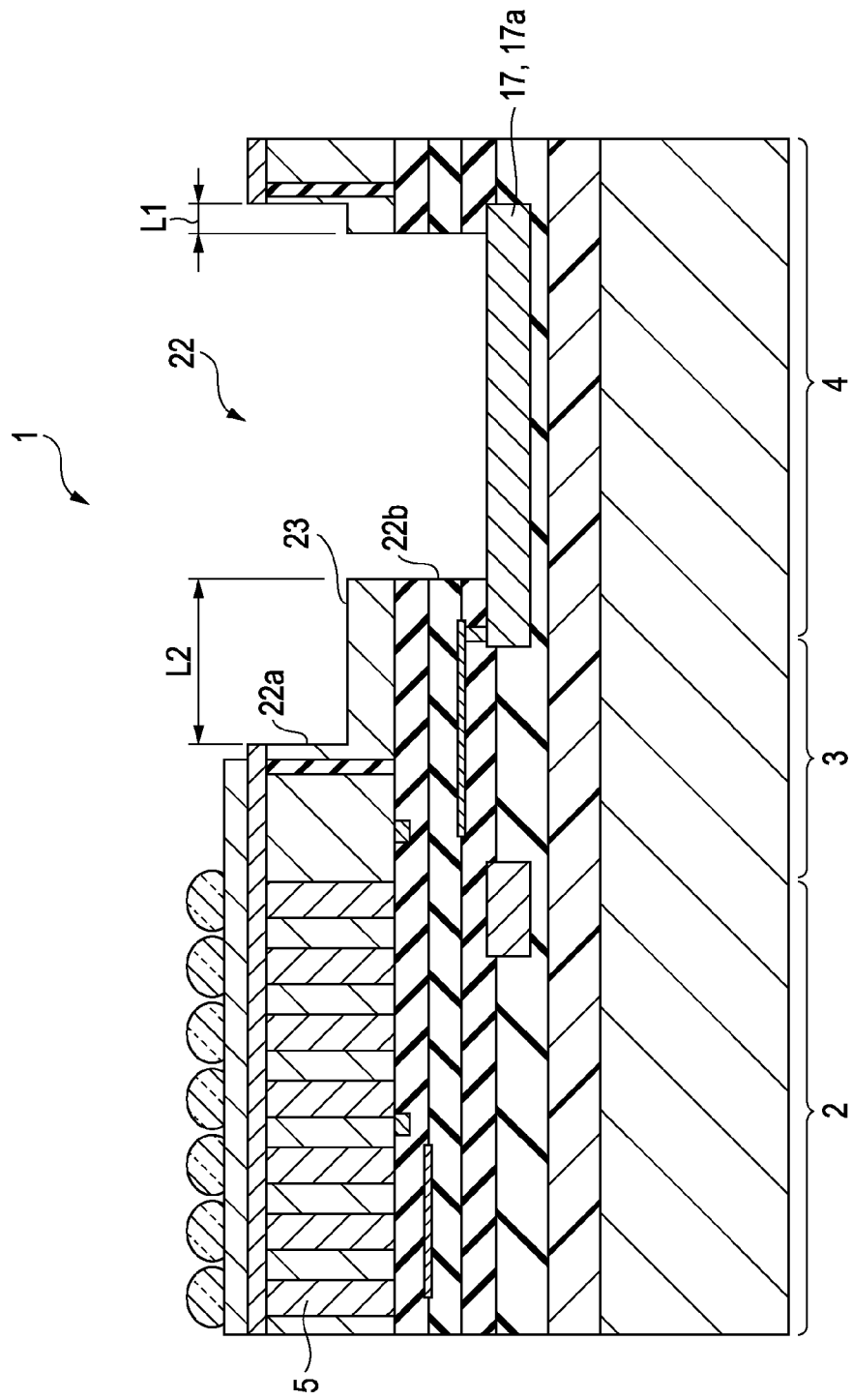

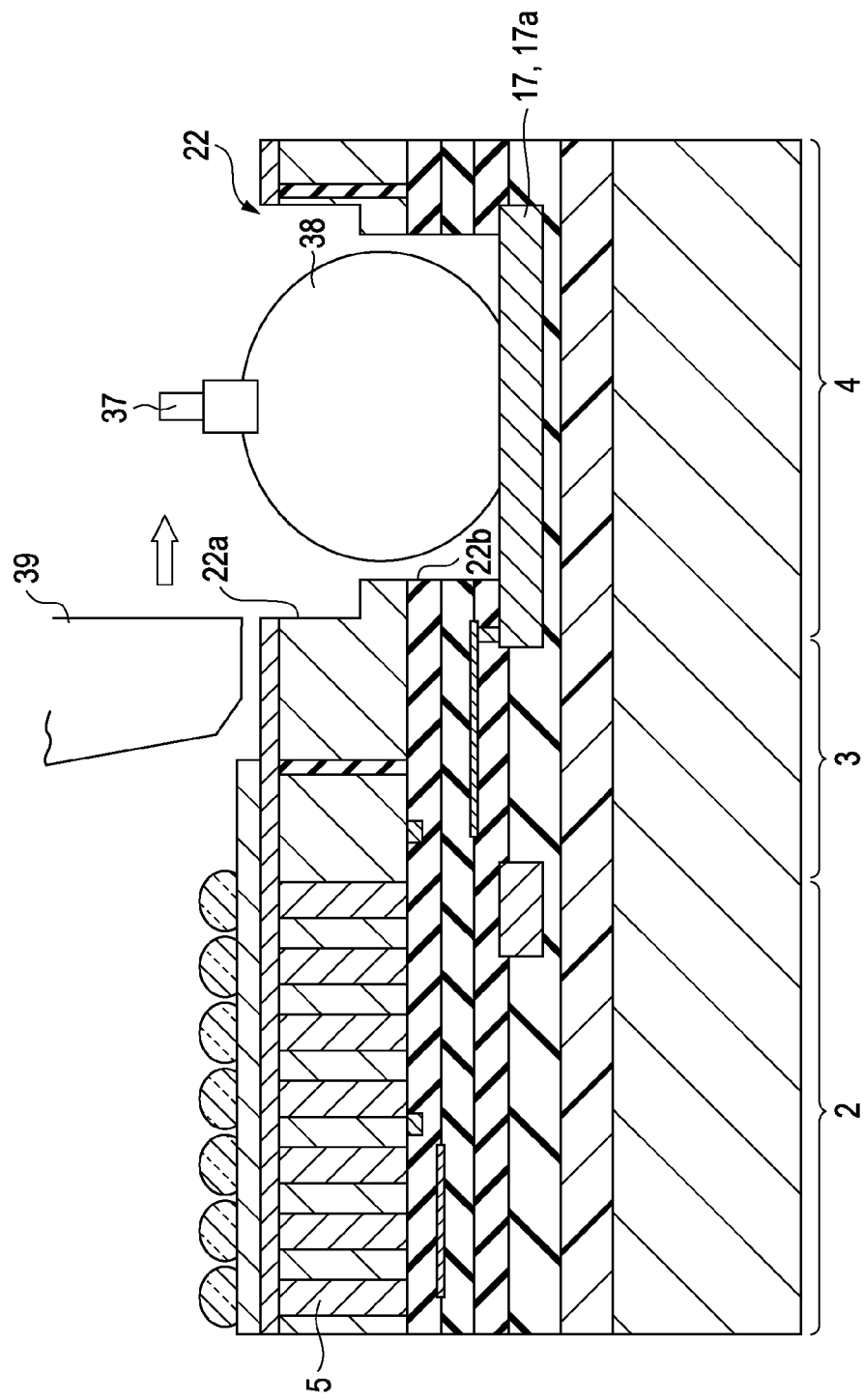

SEMICONDUCTOR DEVICE

BACKGROUND OF THE INVENTION

1. Field of the Invention

The present invention relates to semiconductor devices. In particular, the present invention relates to a semiconductor device suitable for application to a solid-state imaging device.

2. Description of the Related Art

Typical examples of a solid-state imaging device include a CCD (Charge Coupled Device) image sensor of a charge transfer type and a CMOS (Complementary Metal Oxide Semiconductor) image sensor for reading data by specifying an X-Y address. These solid-state imaging devices are similar to each other in that a light-receiving section formed of a photo diode is provided for each of pixels two-dimensionally disposed and light entering this light-receiving section is converted to electrons.

In general, most solid-state imaging devices have a structure in which light enters from a side where a wiring layer is formed. In a solid-state imaging device of this type, sensitivity may be degraded by the wiring layer that prevents the incident light from entering pixels by reflection. Moreover, with reflected light from the wiring layer entering adjacent pixels, color mixing may occur.

To get around these problems, in the related art, a solid-state imaging device of a so-called back-illuminated-type is suggested (refer to Japanese Unexamined Patent Application Publication No. 2005-209677) in which light enters from a side opposite to the side where the wiring layer is formed.

SUMMARY OF THE INVENTION

In the solid-state imaging device disclosed in Japanese Unexamined Patent Application Publication No. 2005-209677, the wiring layer including an external connection electrode is formed on the back (rear) side, when viewed from a light entering side, of a semiconductor device layer having a light-receiving section. Therefore, to expose the external connection electrode, an opening is preferably formed in a concave shape to a depth so as to penetrate through the semiconductor device layer or even further. In such cases, the external connection electrode is in a state of being exposed as an electrode pad at the bottom of the opening. Thus, when a wire is connected by, for example, wire bonding, to the external connection electrode exposed via the opening, the tip of a capillary tends to make contact with the edge of the opening.

It is desirable to provide a mechanism capable of preventing the tip of a connecting tool from making contact with the edge of an opening without expanding the area of an electrode pad when a conductor is connected by using the connecting tool to an external connection electrode exposed as an electrode pad at the bottom of the opening.

A semiconductor device according to an embodiment of the present invention includes a semiconductor device layer, a multilayered wiring section formed of a plurality of wiring layers and a plurality of interlayer insulating films on one surface of the semiconductor device layer, an external connection electrode formed on one of the plurality of wiring layers, and an opening formed in a concave shape extending from the semiconductor device layer to the multilayered wiring section so as to expose a surface of the external connection electrode, wherein the opening has a larger opening diameter at an end farther from the external connection electrode than at another end closer to the external connection electrode.

In the semiconductor device according an embodiment of the present invention, the area of an electrode pad exposed at the bottom of the opening is defined by the smaller opening diameter. Also, with the larger opening diameter at the end farther from the external connection electrode, the tip of a connecting tool for use in connecting a conductor is less prone to making contact with the edge of the opening.

According to the embodiment of the present invention, when a conductor is connected by using the connecting tool to the external connection electrode exposed as an electrode pad at the bottom of the opening, the tip of the connecting tool can be prevented from making contact with the edge of the opening without expanding the area of the electrode pad.

BRIEF DESCRIPTION OF THE DRAWINGS

FIG. 1 is a section view of main parts of the structure of a solid-state imaging device according to a first embodiment of the present invention;

FIGS. 3A and 3B are a second set of diagrams for illustrating the method of manufacturing the solid-state imaging device according to the first embodiment of the present invention;

FIGS. 15A and 15B are diagrams for illustrating a method of manufacturing the solid-state imaging device according to the second embodiment of the present invention;

FIG. 16 is a section view of main parts of the structure of a solid-state imaging device according to a third embodiment of the present invention;

FIG. 19 is a diagram depicting the state of arrangement of the solid-state imaging device in the comparison example and a measuring tool.

DESCRIPTION OF THE PREFERRED EMBODIMENTS

Figure 2A:
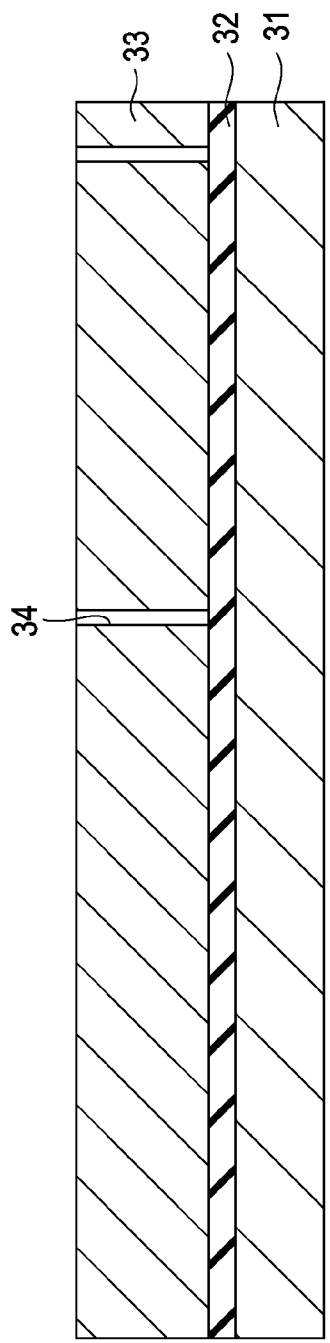
FIGS. 2A to 2C are a first set of diagrams for illustrating a method of manufacturing the solid-state imaging device according to the first embodiment of the present invention.

In the following, specific embodiments of the present invention are described in detail with reference to the drawings.

Preferred embodiments (referred to below as embodiments) are described in the following order:

1. First Embodiment
2. Second Embodiment
3. Third Embodiment

Note that description is made for the case where the structure of the semiconductor device according to any of the embodiments of the present invention is applied to, by way of example, a solid-state imaging device.

1. First Embodiment

Structure of the Solid-State Imaging Device

FIG. 1 is a section view of main parts of the structure of a solid-state imaging device according to a first embodiment of the present invention. A solid-state imaging device 1 is used as, for example, a CMOS image sensor. The solid-state imaging device 1 includes, in a plan view, a pixel region 2, a peripheral circuit region 3, and an external connection region 4. In the pixel region 2, a plurality of light-receiving sections 5 and a plurality of microlenses 6 are two-dimensionally disposed for respective pixels. In the peripheral circuit region 3, although not shown, a vertical driving circuit for selecting a pixel in a vertical direction and a horizontal driving circuit for selecting a pixel in a horizontal direction are disposed, for example. In the pixel region 2, a transistor Tr1 is formed; in the peripheral circuit region 3, transistors Tr2 and Tr3 are formed. Note that only the gates of the transistors Tr are depicted in FIG. 1.

For each unit pixel, one light-receiving section 5 is provided. The light-receiving section 5 can convert light entering that light-receiving section 5 into electrons (photoelectric conversion). The light-receiving section 5 is configured of, for example, a PN-junction photodiode. The light-receiving section 5 is formed on a semiconductor device layer 7. The semiconductor device layer 7 is configured by, for example, using a semiconductor layer of silicon or the like. Each of the microlenses 6 gathers light entering from the outside into its corresponding light-receiving section 5. The microlenses 6 are disposed so as to have a one-to-one relation with the light-receiving sections 5.

Of first and second surfaces of the semiconductor device layer 7, a light-transmittable protective film 8 is formed on the first surface, which serves as a light entering side of the semiconductor device layer 7. A color filter layer 9 is also formed on the protective film 8. On this color filter layer 9, the microlenses 6 described above are formed. Although not shown, the color filter layer 9 is divided into a red filter section, a green filter section, and a blue filter section. The red filter section allows light of red components to be selectively transmitted, the green filter section allows light of green components to be selectively transmitted, and the blue filter section allows light of blue components to be selectively transmitted. The color filter layer 9 is color-coded for each light-receiving section 5.

On the other hand, a multilayered wiring section 11 is formed on the second surface (lower side in FIG. 1) of the semiconductor device layer 7 opposite to the light entering side. The multilayered wiring section 11 is formed of a plurality of wiring layers and a plurality of interlayer insulating films. In more detail, the multilayered wiring section 11 is formed of a first interlayer insulating film 12, a first wiring layer 13, a second interlayer insulating film 14, a second wiring layer 15, a third interlayer insulating film 16, a third wiring layer 17, and a fourth interlayer insulating film 18. These layers and films are laminated in that order from a semiconductor device layer 7 side. Note that each wiring layer is only partially depicted. Also, the number of wiring layers and the number of interlayer insulating films can be changed (increased or decreased) as necessary.

The first interlayer insulating film 12 is formed on the second surface of the semiconductor device layer 7. The first wiring layer 13 is formed on a surface of the first interlayer insulating film 12 opposite to the semiconductor device layer 7. The second interlayer insulating film 14 is laminated on the first interlayer insulating film 12 so as to cover the first wiring layer 13. The second wiring layer 15 is formed on the second interlayer insulating film 14. The third interlayer insulating film 16 is laminated on the second interlayer insulating film 14 so as to cover the second wiring layer 15. The third wiring layer 17 is formed on a surface of the third interlayer insulating film 16. The fourth interlayer insulating film 18 is laminated on the third interlayer insulating film 16 so as to cover the third wiring layer 17.

Each of the interlayer insulating films 12, 14, 16, and 18 may be any interlayer insulating film for use as a normal LSI (Large Scale Integrated circuit) interlayer insulating film, such as a silicon oxide film, fluorinated silicon oxide film, or organic Low-K film (low-dielectric-constant interlayer film). The wiring layers 13, 15, and 17 are formed with a metal wiring layer. Here, by way of example, the first wiring layer 13 and the second wiring layer 15 are each formed with a copper wiring layer, while the third wiring layer 17 is formed with an aluminum wiring layer. The second wiring layer 15 includes a copper lead wire 15a, and the third wiring layer 17 includes an aluminum external connection electrode 17a. The lead wire 15a is electrically connected to the external connection electrode 17a via a contact section CH1. The contact section CH1 is formed so as to penetrate through the third interlayer insulating film 16. The lead wire 15a is disposed in the peripheral circuit region 3, and the external connection electrode 17a is disposed in the external connection region 4.

A guard ring 19 is formed in the multilayered wiring section 11. The guard ring 19 is formed of a contact section CH2, a portion 13b of the first wiring layer 13, a contact section CH3, a portion 15b of the second wiring layer 15, and a contact section CH4, each of which is rectangular when viewed from above. The contact section CH2 is formed in a rectangular shape in a plan view so as to penetrate through the first interlayer insulating film 12. The contact section CH3 is formed in a rectangular shape in a plan view so as to penetrate through the second interlayer insulating film 14. The contact section CH4 is formed in a rectangular shape in a plan view so as to penetrate through the third interlayer insulating film 16. The contact section CH1 described above is disposed outside of the contact section CH4. The contact sections CH2, CH3, and CH4 are formed so as to have a positional relation in which these sections are superposed in a plan view. For joining these contact sections in a thickness direction, the portion 13b of the first wiring layer 13 and the portion 15b of the second wiring layer 15 are formed so as to have a positional relation in which these portions are superposed in a plan view.

For electrical connection between a device circuit including transistors and the first wiring layer 13, the contact section CH2 and other contact sections not shown are formed so as to penetrate through the first interlayer insulating film 12. For electrical connection between the first wiring layer 13 and the second wiring layer 15, the contact section CH3 and other contact sections not shown are formed so as to penetrate through the second interlayer insulating film 14. For electrical connection between the second wiring layer 15 and the third wiring layer 17, the contact sections CH1 and CH4 and other contact sections not shown are formed so as to penetrate through the third interlayer insulating film 16.

The multilayered wiring section 11 has a supporting substrate 21 bonded thereto via an adhesive layer 20. The adhesive layer 20 is interposed between the multilayered wiring section 11 and the supporting substrate 21. The adhesive layer 20 is made of, for example, a thermosetting resin material, and is interposed between the fourth interlayer insulating film 18 and the supporting substrate 21. The supporting substrate 21 is a rigid substrate configured by using a material that retains a mechanical strength, such as a silicon substrate or glass substrate. The supporting substrate 21 is a so-called reinforcing member that ensures the strength of the solid-state imaging device configured to include, for example, the microlenses 6, the semiconductor device layer 7, the color filter layer 9, and the multilayered wiring section 11 described above.

In the external connection region 4, a plurality of openings 22 are provided (only one opening is depicted in the drawings). The opening 22 is formed in a concave shape from the semiconductor device layer 7 to the multilayered wiring section 11. The opening 22 is formed so as to penetrate through the semiconductor device layer 7, the protective film 8 covering the surface of the semiconductor device layer 7, and further the interlayer insulating films 12, 14, and 16 of the multilayered wiring section 11. At the bottom of the opening 22, the surface of the external connection electrode 17a is exposed as a pad surface of an electrode pad.

The opening 22 has a first opening 22a formed with a first opening diameter d1 and a second opening 22b formed with a second opening diameter d2. The relation in magnitude between the first opening diameter d1 and the second opening diameter d2 is set at d1>d2. The area of the electrode pad exposed at the bottom of the opening 22 is defined by the second opening diameter d2. In a depth direction of the opening 22, the first opening 22a is disposed farther from the external connection electrode 17a than the second opening 22b, and the second opening 22b is disposed closer to the external connection electrode 17a than the first opening 22a. That is, the first opening 22a is disposed on a front side when viewed from the light entering side, and the second opening 22b is disposed on a back side when viewed from the light entering side.

At the boundary between the first opening 22a and the second opening 22b, a step 23 is provided in accordance with the difference between the opening diameters d1 and d2 described above. That is, the opening 22 has a so-called step-attached structure in which a step is provided at some midpoint in the depth direction. The step 23 of the opening 22 is provided in the depth direction and on a semiconductor device layer 7 side of the opening 22. In other words, the semiconductor device layer 7 has a structure with a step provided in the opening 22.

In the semiconductor device layer 7, an insulating layer 24 surrounding the outside of the opening 22 is formed. The insulating layer 24 penetrates through the semiconductor device layer 7 from one end to the other end in a thickness direction of the semiconductor device layer 7. A portion 24a of the insulating layer 24 is disposed at a boundary between the peripheral circuit region 3 and the external connection region 4 in a direction of the plane of the supporting substrate 21. Also, the guard ring 19 described above is formed in the multilayered wiring section 11 so as to surround the outside of the opening 22 (the second opening 22b).

Method of Manufacturing the Solid-State Imaging Device

Next, the method of manufacturing the solid-state imaging device according to the first embodiment of the present invention is described. First, as depicted in FIG. 2A, in an SOI (Silicon On Insulator) substrate configured to have a holding substrate 31, a buried oxide layer 32, and a semiconductor layer 33 laminated in that order, a trench 34 is formed by, for example, dry etching. The trench 34 is formed so as to penetrate through the semiconductor layer 33. Also, the trench 34 is formed in a continuous frame shape so as to be positioned around the opening 22, which will be described further below. The holding substrate 31 is formed of, for example, a silicon substrate having a thickness of approximately 700 µm. The buried oxide layer 32 is formed of, for example, a silicon oxide layer having a thickness of 1 µm to 2 µm. The semiconductor layer 33 is formed of, for example, a silicon layer having a thickness of 1 µm to 20 µm. The semiconductor layer 33 is a layer corresponding to the semiconductor device layer 7 described above.

Figure 2B:
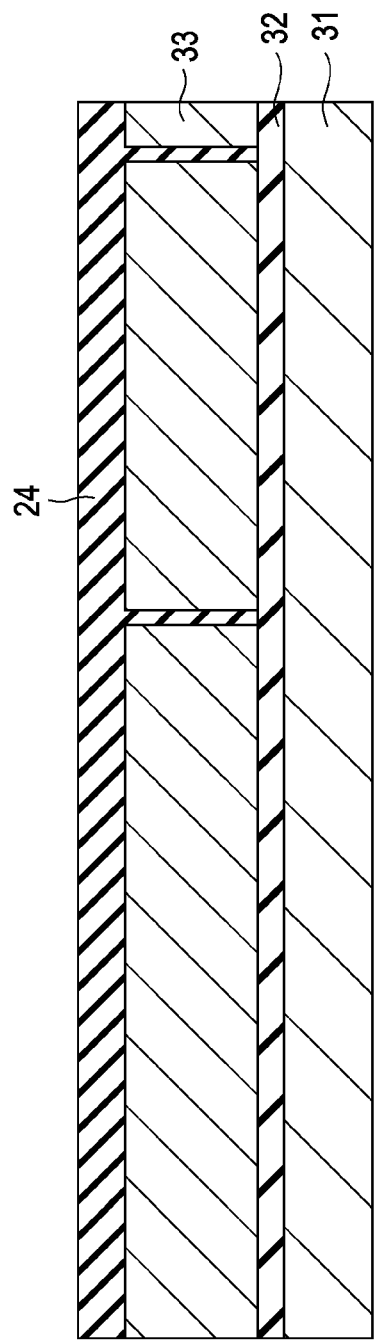

Next, as depicted in FIG. 2B, the insulating layer 24 is laminated on the semiconductor layer 33 by, for example, CVD, so as to fill the trench 34. The insulating layer 24 is formed of, for example, a silicon oxide layer or a silicon nitride layer.

Figure 2C:
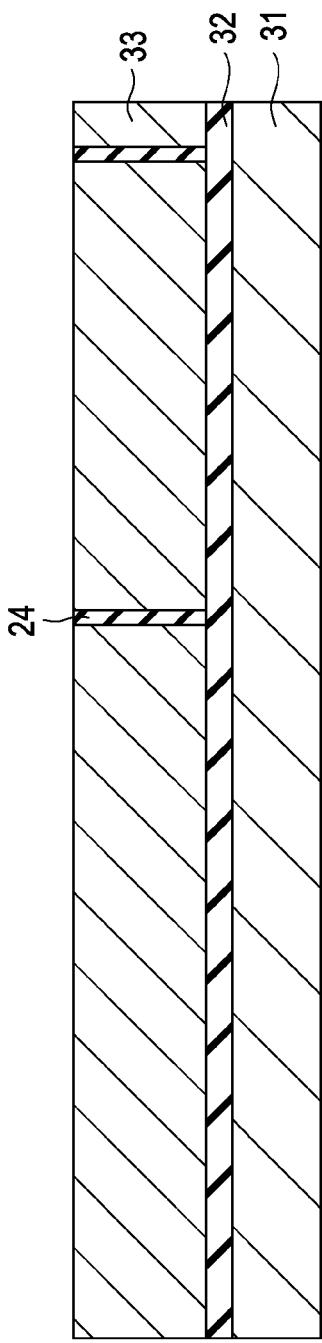

Next, as depicted in FIG. 2C, excessive insulating material on the semiconductor layer 33 is removed by, for example, dry etching, thereby causing the insulating layer 24 to be left only inside of the semiconductor layer 33.

Next, as depicted in FIG. 3A, the light-receiving sections 5 are formed inside of the semiconductor layer 33 for the respective pixels, and also the transistors Tr1, Tr2, and Tr3 are formed on the surface of the semiconductor layer 33. At this stage, the semiconductor layer 33 becomes the semiconductor device layer 7 including the light-receiving sections 5 and the insulating layer 24. Note that the insulating layer 24 may be formed after the light-receiving sections 5 and the transistors Tr1, Tr2, and Tr3 are formed.

Next, as depicted in FIG. 3B, the multilayered wiring section 11 is formed on the second surface of the semiconductor device layer 7. The multilayered wiring section 11 is formed in the following procedure. First, the first interlayer insulating film 12 is formed on the second surface of the semiconductor device layer 7, and then the first wiring layer 13 is formed on that first interlayer insulating film 12. Next, the second interlayer insulating film 14 is formed on the first interlayer insulating film 12 so as to cover the first wiring layer 13, and then the second wiring layer 15 is formed on that second interlayer insulating film 14. Next, the third interlayer insulating film 16 is formed on the second interlayer insulating film 14 so as to cover the second wiring layer 15, and then the third wiring layer 17 is formed on that third interlayer insulating film 16. Next, the fourth interlayer insulating film 18 is formed on the third interlayer insulating film 16 so as to cover the third wiring layer 17. In the course of the formation, the guard ring 19 is also formed. The first wiring layer 13 and the second wiring layer 15 are formed from copper, and the third wiring layer 17, which is the uppermost layer, is formed from aluminum. The copper wirings can be formed by applying, for example, a damascene process. The aluminum wiring can be formed by applying, for example, vacuum vapor deposition and lithography. On the third wiring layer 17, the external connection electrode 17a is formed so as to be positioned in the external connection region 4 described above.

Figure 4:
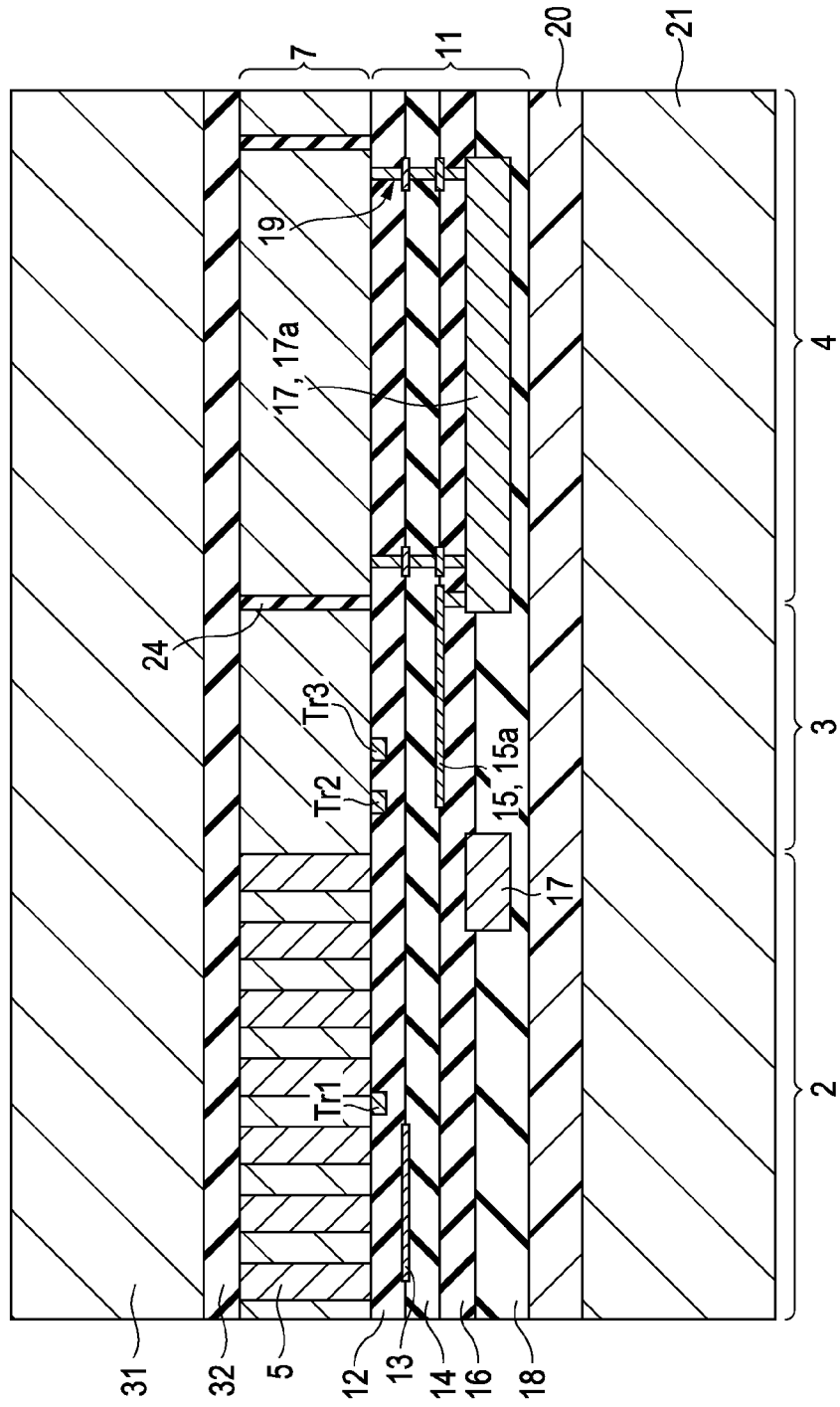
FIG. 4 is a third diagram for illustrating the method of manufacturing the solid-state imaging device according to the first embodiment of the present invention.

Next, as depicted in FIG. 4, the supporting substrate 21 is bonded onto the multilayered wiring section 11 via the adhesive layer 20. As an example of the material of the adhesive layer 20, a resin material can be used, such as organic SOG (Spin On Glass), inorganic SOG, or polyimide. The resin material for use in bonding the substrate is cured by heating.

Figure 5:
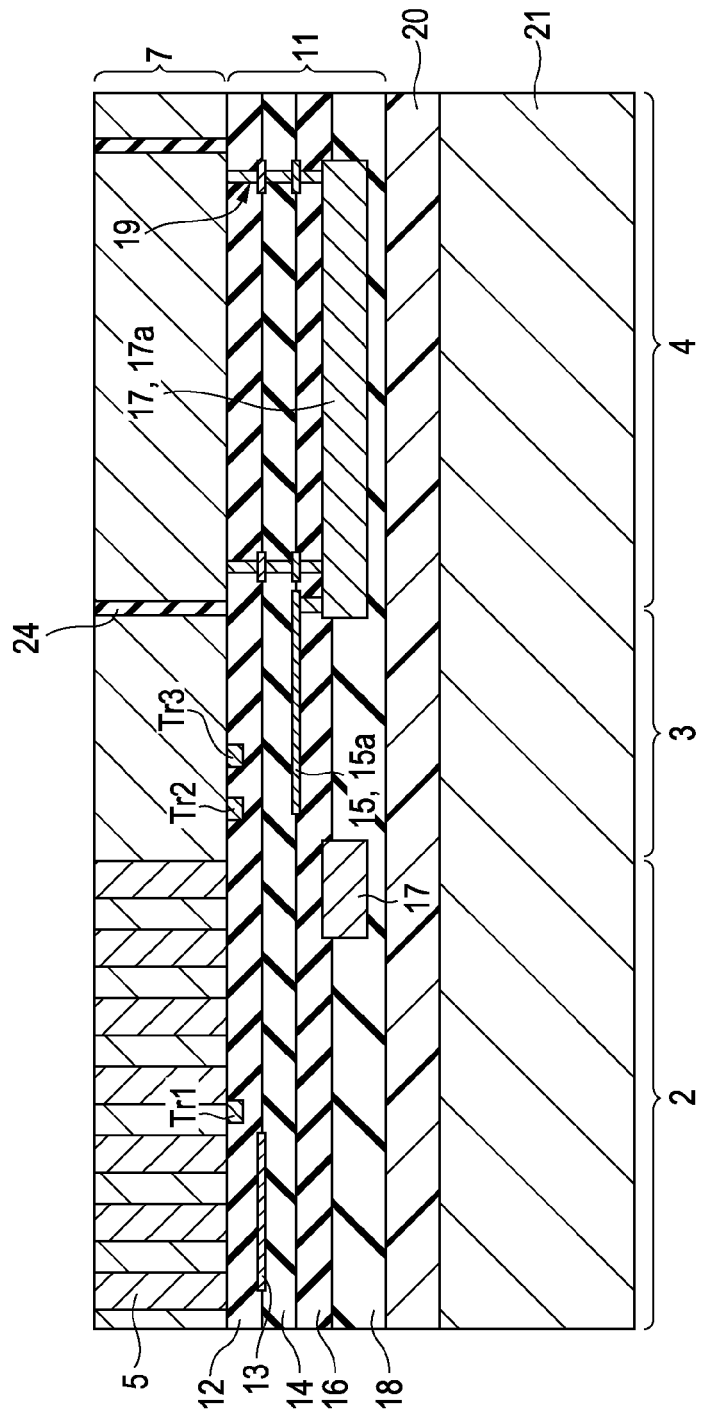
FIG. 5 is a fourth diagram for illustrating the method of manufacturing the solid-state imaging device according to the first embodiment of the present invention.

Next, as depicted in FIG. 5, the holding substrate 31 and the buried oxide layer 32 described above are removed. As a specific removing method, for example, CMP (Chemical Mechanical Polishing), dry etching, or wet etching can be used.

Figure 6:
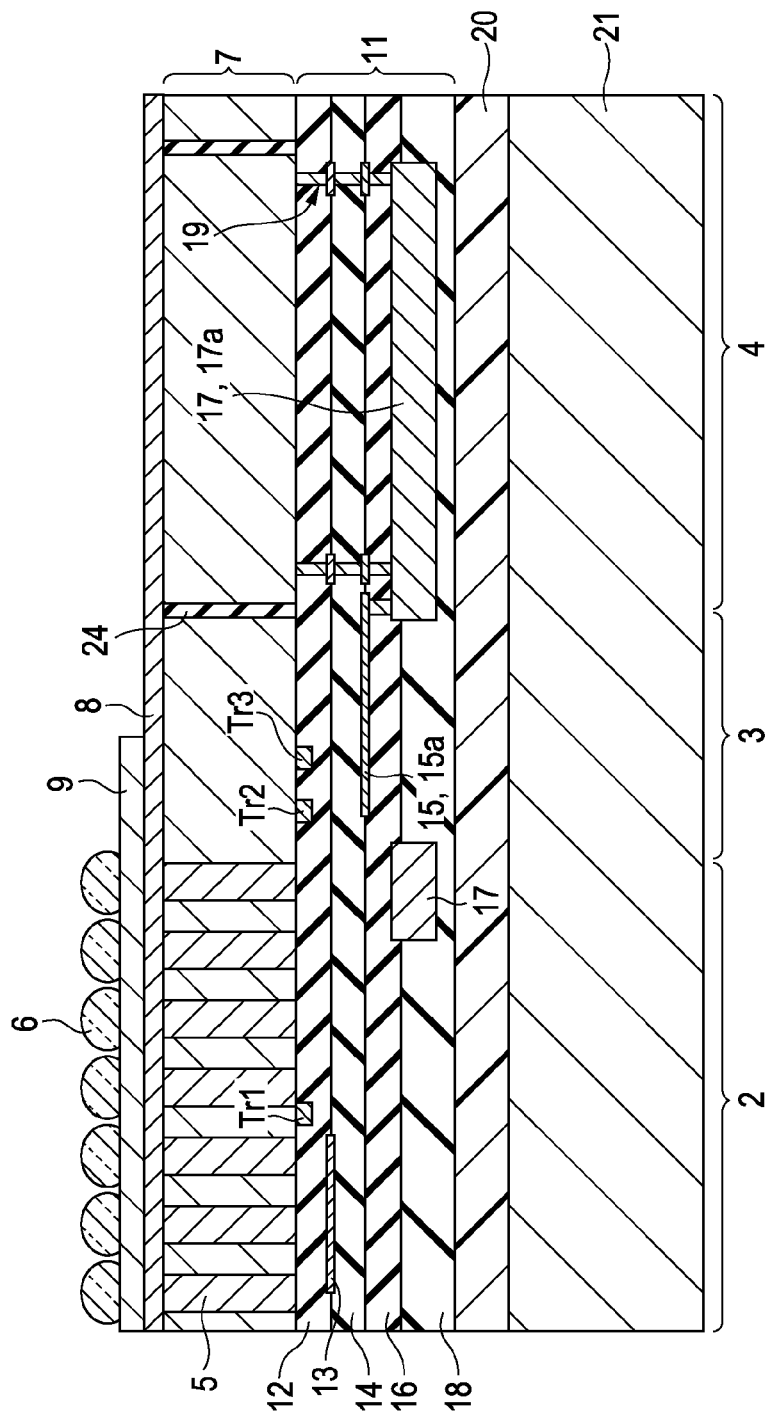
FIG. 6 is a fifth diagram for illustrating the method of manufacturing the solid-state imaging device according to the first embodiment of the present invention.

Next, as depicted in FIG. 6, the protective film 8 is formed by, for example, CVD, on the first surface of the semiconductor device layer 7. Furthermore, the color filter layer 9 is formed on the protective film 8, and then the microlenses 6 are formed on the color filter layer 9 correspondingly to the light-receiving sections 5.

Figure 7:
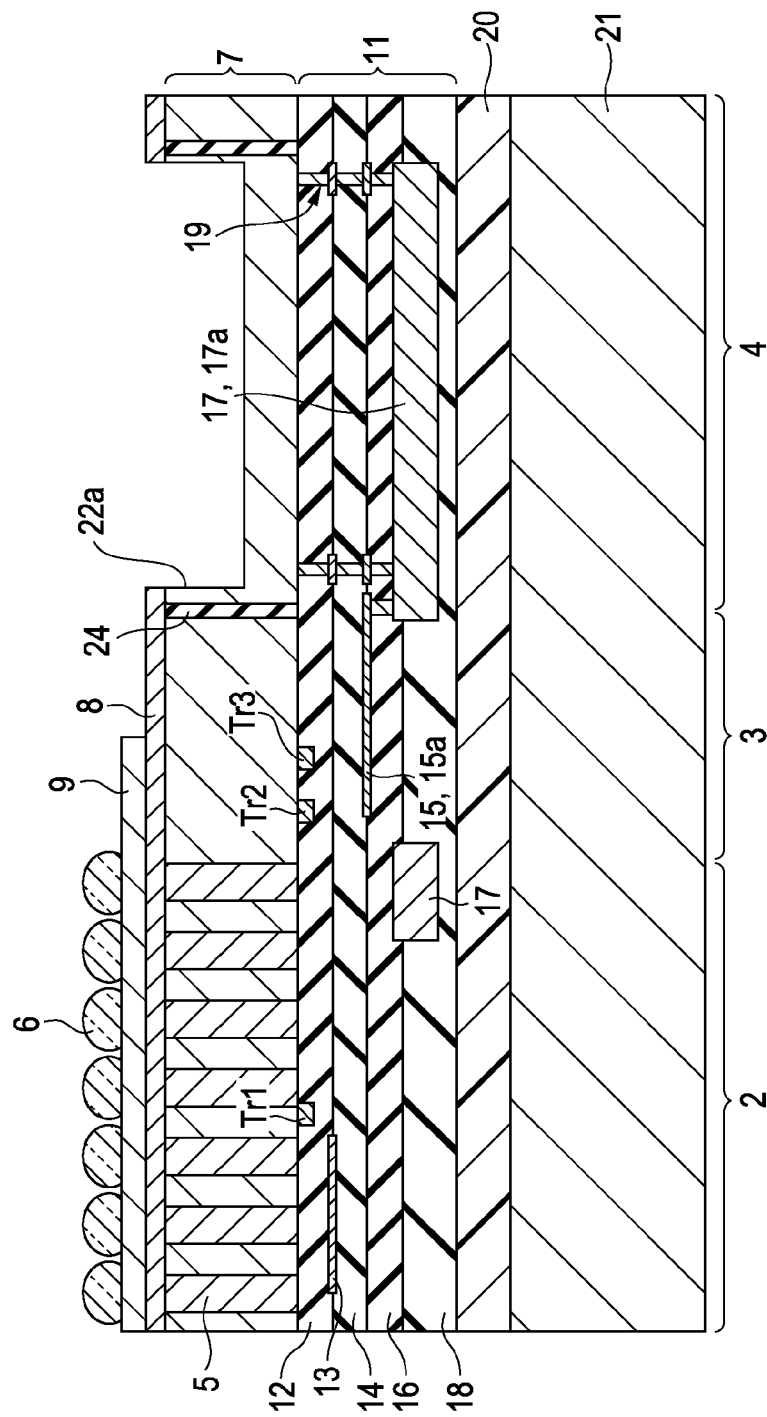
FIG. 7 is a sixth diagram for illustrating the method of manufacturing the solid-state imaging device according to the first embodiment of the present invention.

Next, as depicted in FIG. 7, the first opening 22a is formed in the semiconductor device layer 7 so as to penetrate through the protective film 8. The first opening 22a is formed in the external connection region 4 and also inside of the insulating layer 24 so as to have the first opening diameter d1 (refer to FIG. 1) described above. The first opening 22a has a depth that is smaller than a total thickness of the semiconductor device layer 7 and the protective film 8 so as not to penetrate entirely through the semiconductor device layer 7. The first opening 22a is formed by, for example, dry etching.

Figure 8:
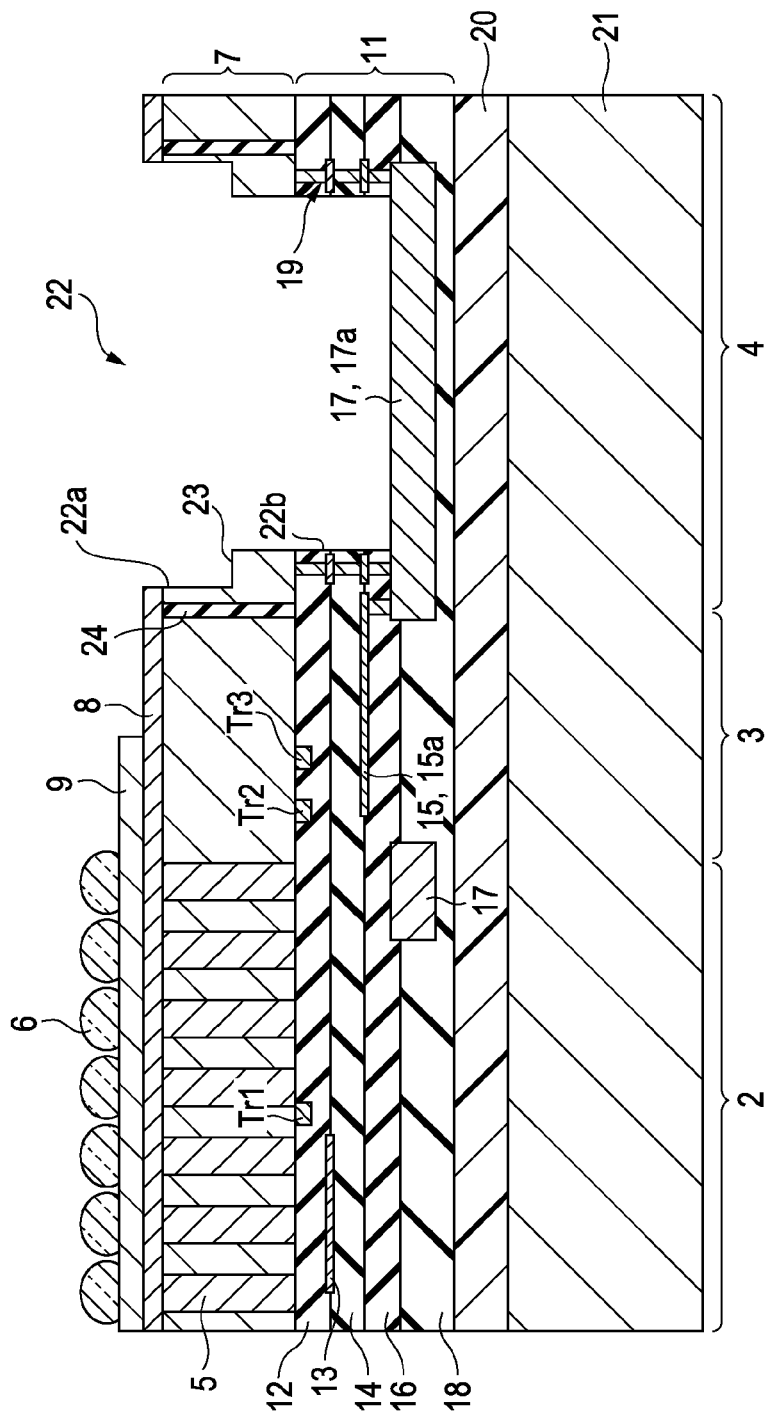
FIG. 8 is a seventh diagram for illustrating the method of manufacturing the solid-state imaging device according to the first embodiment of the present invention.

Next, as depicted in FIG. 8, the second opening 22b is formed from the semiconductor device layer 7 to the multilayered wiring section 11. The second opening 22b is formed to have an opening diameter (second opening diameter d2) smaller than that of the first opening 22a. The second opening 22b is formed to penetrate through the semiconductor device layer 7 and the interlayer insulating films 12, 14, and 16 so as to expose the surface of the external connection electrode 17a. As with the first opening 22a described above, the second opening 22b is formed by, for example, dry etching. In this case, dry etching is performed twice, when the first opening 22a is formed and when the second opening 22b is formed, by exchanging a mask for use in etching. With this, the opening 22 having the step 23 on the semiconductor device layer 7 side is formed.

In the solid-state imaging device according to the first embodiment of the present invention, light entering through the microlenses 6 is received (photoelectrically converted) at the light-receiving sections 5 without being interrupted or reflected by any wiring layer or transistor. Therefore, the sensitivity of the imaging device can be improved, and color mixing can also be prevented. Furthermore, since the opening 22 provided in the external connection region 4 is configured to include the first opening 22a and the second opening 22b having an opening diameter smaller than that of the first opening 22a, when wire bonding is performed on the external connection electrode 17a, effects are obtained as described below.

Figure 9:
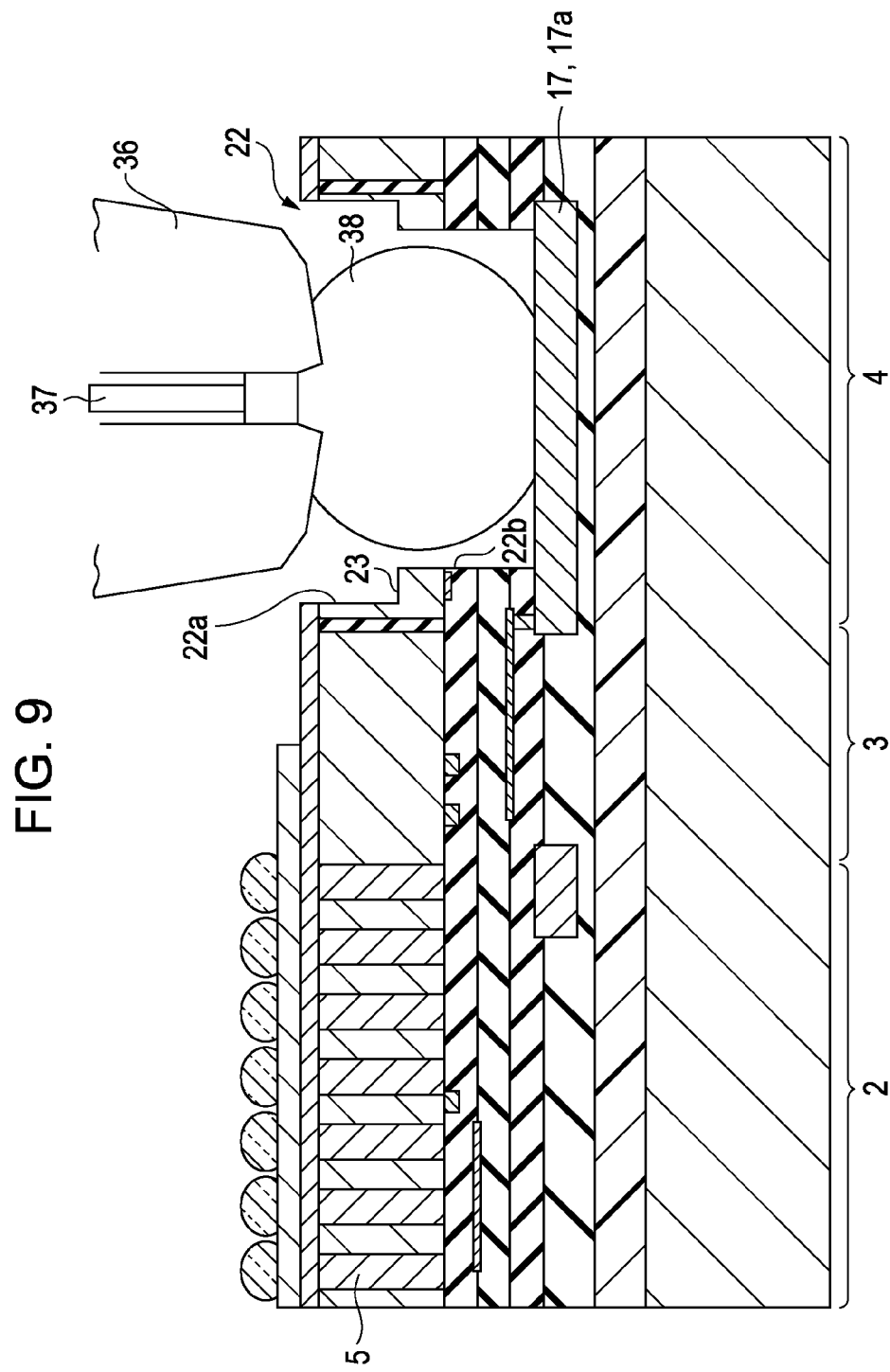
FIG. 9 is a diagram of the state of wire bonding in the solid-state imaging device according to the first embodiment of the present invention.

That is, in wire bonding, as depicted in FIG. 9, a metal wire 37, such as a gold wire, drawn through a capillary 36 has a ball 38 formed at one tip thereof, and this ball 38 is pressed against the surface (electrode-pad surface) of the external connection electrode 17a with the tip of the capillary 36 to form a junction. In wire bonding, the capillary 36 corresponds to a connecting tool, and the wire 37 corresponds to a conductor. In this case, of the first opening 22a and the second opening 22b forming the opening 22, if the first opening 22a closer to the opening edge is formed larger, the tip of the capillary 36 is less prone to making contact with the edge of the opening 22. For this reason, positional interference between the capillary 36 and the solid-state imaging device (contact at the time of wire bonding) can be prevented. Also, the area of the electrode pad exposed at the bottom of the opening 22 is defined by the opening diameter d2 (refer to FIG. 1) of the second opening 22b smaller than that of the first opening 22a. Therefore, the tip of the capillary 36 can be effectively prevented from making contact with the edge of the opening 22 without expanding the area of the electrode pad.

Figure 10:
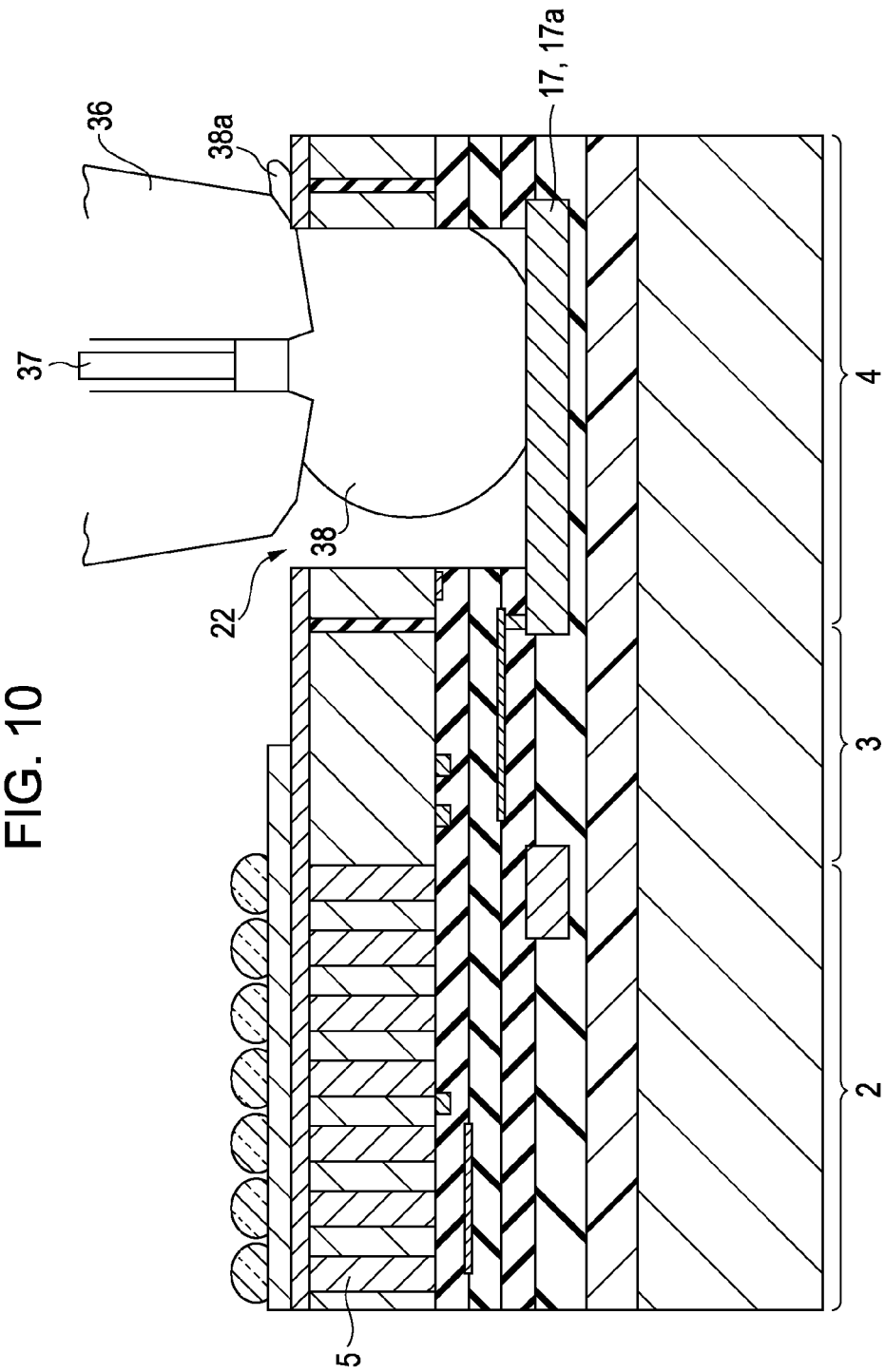
FIG. 10 is a diagram of the state in which a positional shift in wire bonding occurs in a solid-state imaging device in a comparison example.
Figure 11:
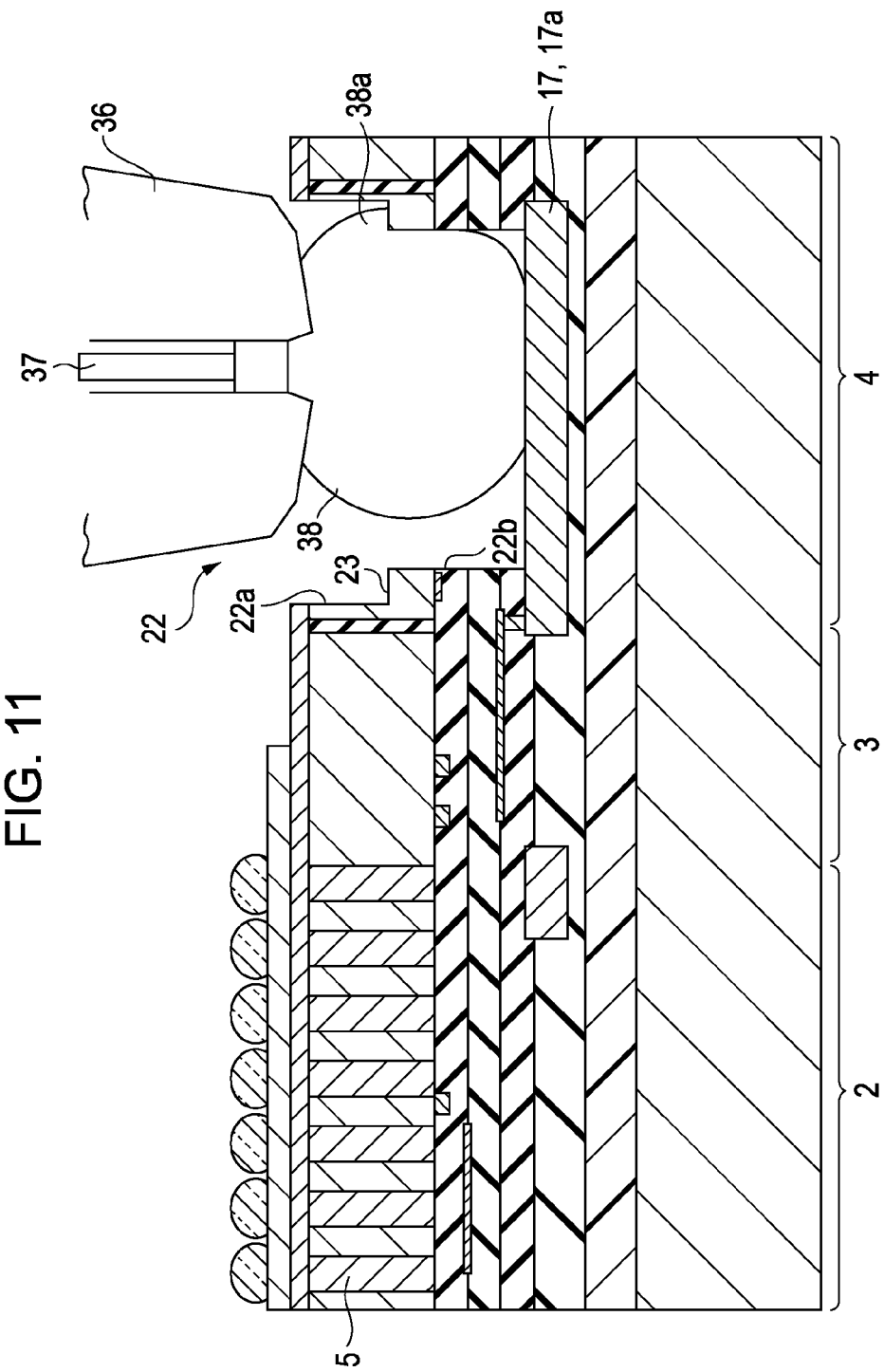
FIG. 11 is a diagram of the state in which a positional shift in wire bonding occurs in the solid-state imaging device according to the first embodiment of the present invention.

When the step 23 corresponding to the difference between the opening diameters d1 and d2 is provided in the opening 22, if a relative shift in position between the capillary 36 and the solid-state imaging device occurs, for example, the step 23 functions as follows. That is, as depicted in FIG. 10, when the opening 22 is configured to have a straight structure without a step (the opening diameter is assumed to be d2), the ball 38 may hit the edge of the opening 22, due to the above positional shift, thereby causing a portion 38a of the ball material to bulge out of the opening 22. By contrast, as depicted in FIG. 11, when the step 23 is provided in the opening 22, even if the ball 38 hits the edge of the second opening 22b due to the above positional shift, the portion 38a of the ball material can be accommodated in the step 23. Thus, the ball material is less prone to bulging out of the opening 22.

In the solid-state imaging device according to the first embodiment of the present invention, the step 23 is provided in the thickness direction of the solid-state imaging device so as to provide the step on the semiconductor device layer 7 side. For this reason, on the multilayered wiring section 11 side, only the second opening 22b having a relatively small opening diameter is formed. Therefore, a wide region can be ensured for forming the wiring layer, compared with the case in which the opening diameter of the opening 22 is increased simply with a straight structure.

Furthermore, in the solid-state imaging device according to the first embodiment of the present invention, the insulating layer 24 is formed inside of the semiconductor device layer 7 so as to surround the outside of the opening 22. For this reason, even when, for example, the ball 38 makes contact with the side surface of the opening 22 due to the positional shift described above, the possibility of the insulating layer 24 being damaged can be prevented. By contrast, when an insulating layer is formed so as to cover the side surface of the opening 22, the insulating layer is prone to being damaged due to a contact with the ball 38. In particular, when wire bonding is performed by using ultrasonic waves, the insulating layer is significantly damaged. This poses a problem of electrical leakage. Moreover, if the electric signal supplied from the wire 37 is a high-frequency signal, a capacitive effect may cause a signal to go beyond the insulating layer on the side surface of the opening 22 and leak out.

Still further, when the side surface of the opening 22 is covered with the insulating layer, the insulating layer is formed after the opening 22 is formed, as a matter of course. In such cases, if the microlenses 6 are formed before the opening 22 is formed and then the insulating layer is formed, the surface of the microlenses 6 is covered with the insulating layer. Therefore, the insulating layer is to be removed from the lens surface. Also, when the microlenses 6 are formed after the opening 22 is formed, unevenness in thickness occurs in the lens material layer due to the influence of the opening 22 when the lens material is applied by spin coating or the like. For this reason, it is difficult to form the microlenses 6 with uniform properties. By contrast, when the insulating layer 24 is formed by trench processing and burying the insulating material, as in the manufacturing method described above, the insulating layer 24 can be left around the opening 22 even when the opening 22 is formed after the microlenses 6 are formed. For this reason, the side surface of the opening 22 may not be covered separately with an insulating layer.

Figure 12:
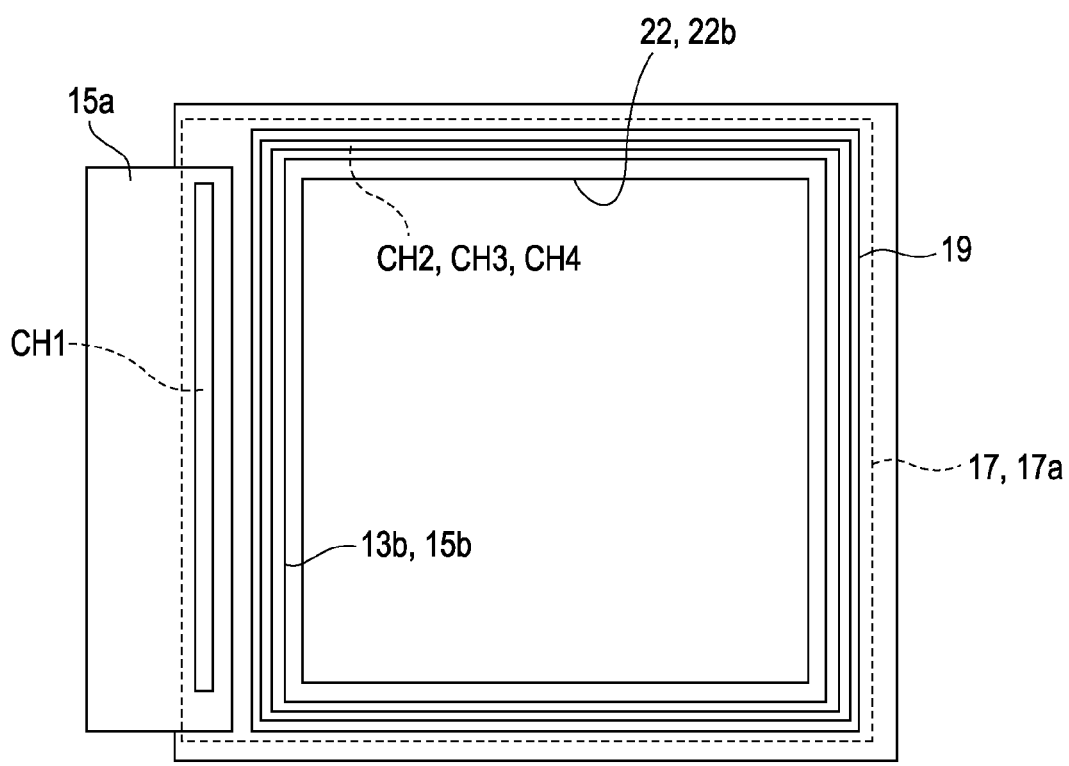
FIG. 12 is a partial plan view of the solid-state imaging device according to the first embodiment of the present invention.
Figure 13A:
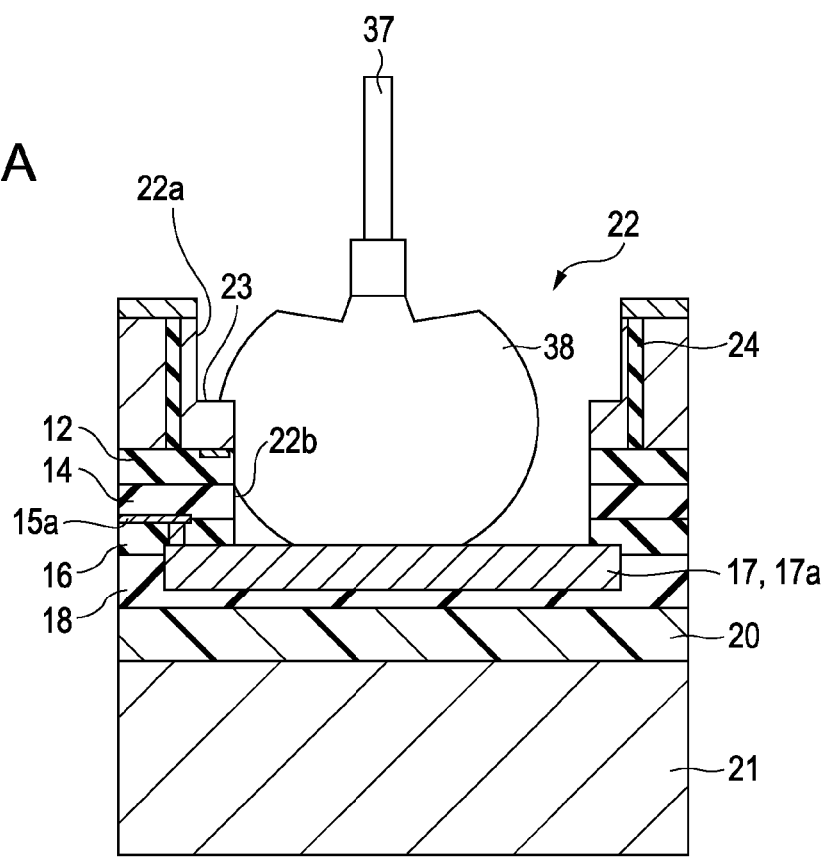
FIGS. 13A and 13B are diagrams for illustrating a guard-ring function.
Figure 13B:
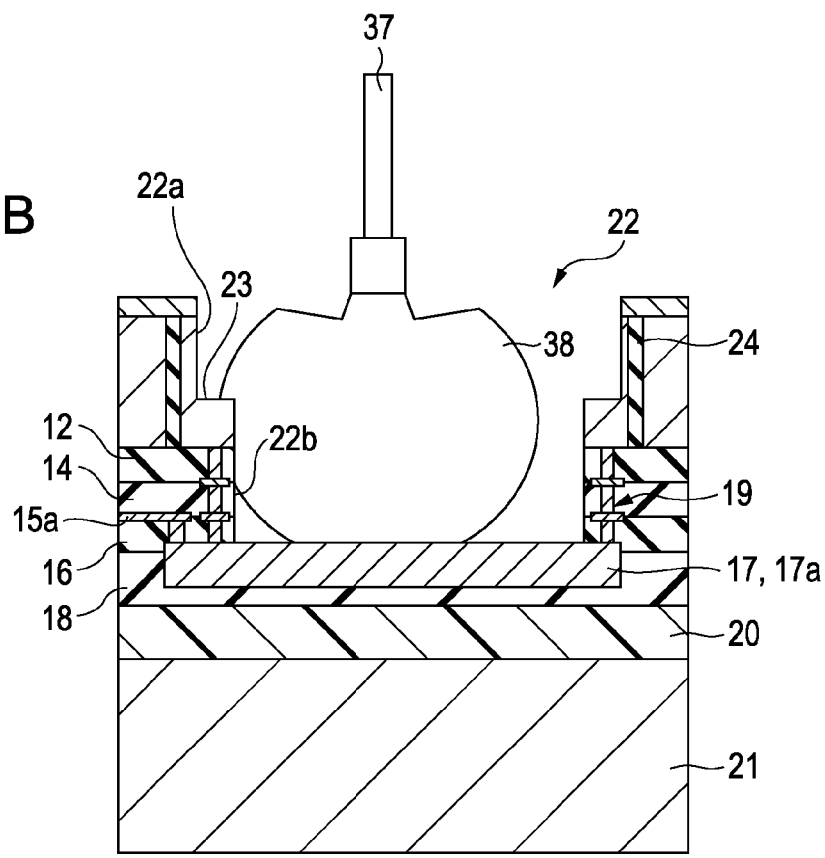

Still further, in the solid-state imaging device according to the first embodiment of the present invention, as depicted in FIG. 12, the guard ring 19 is formed inside of the multilayered wiring section 11 so as to surround the outside of the opening 22 (second opening 22b). Therefore, effects can be obtained, as described below. That is, when the guard ring 19 is not formed, as depicted in FIG. 13A, if the ball 38 of the wire 37 makes contact with the side surface of the opening 22, the exposed boundary surface of the interlayer insulating film may be peeled off, and this may cause corrosion of the lead wire 15a. By contrast, when the guard ring 19 is formed, as depicted in FIG. 13B, even if the ball 38 of the wire 37 makes contact with the side surface of the opening 22, the guard ring 19 prevents the interlayer insulating film from being peeled off. Therefore, corrosion of the lead wire 15a due to peeling-off of the interlayer insulating film can be prevented.

2. Second Embodiment

Figure 14:
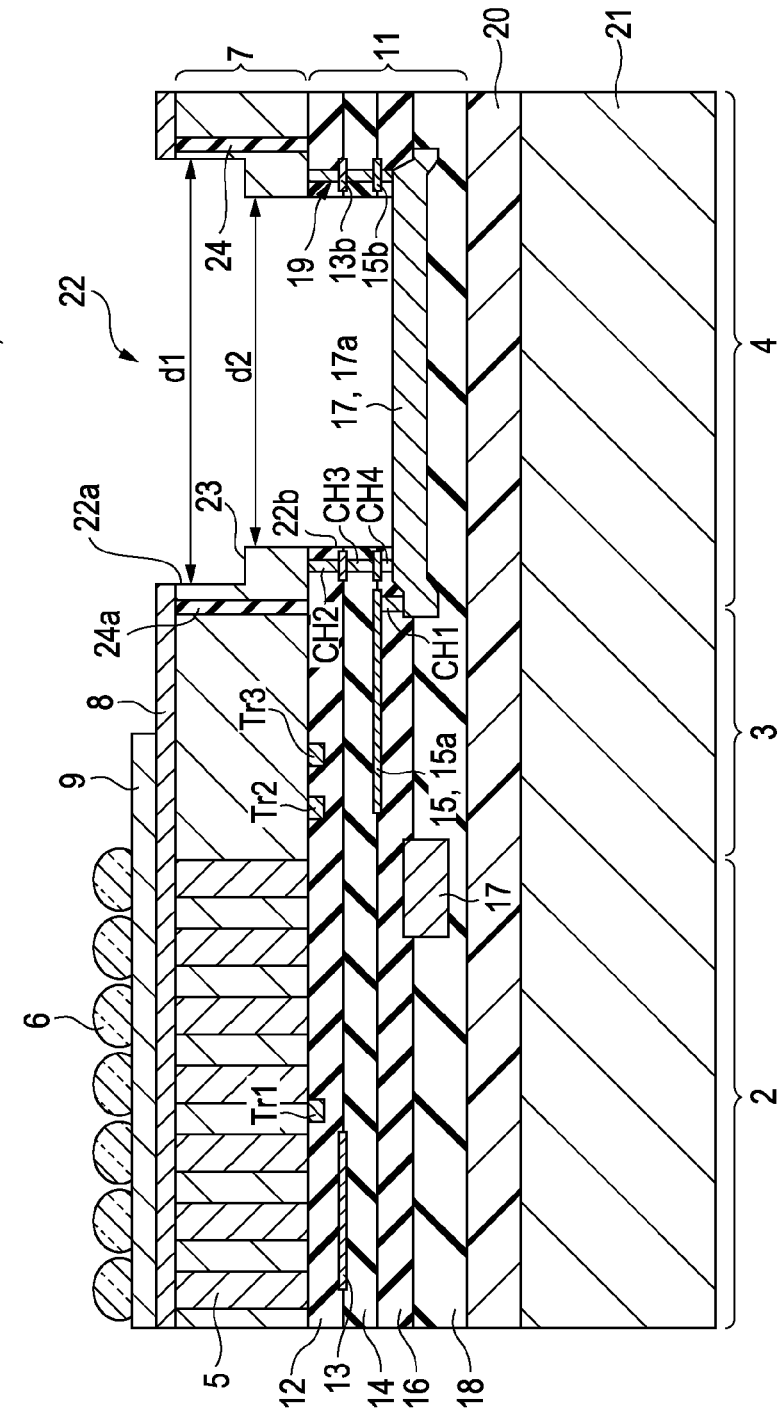
FIG. 14 is a section view of main parts of the structure of a solid-state imaging device according to a second embodiment of the present invention.

FIG. 14 is a section view of main parts of the structure of a solid-state imaging device according to a second embodiment of the present invention. In the solid-state imaging device 1 depicted in the drawing, in particular, the structure of the external connection electrode 17a is different from that of the first embodiment described above. That is, while the external connection electrode 17a is configured to be flat in the first embodiment described above, the external connection electrode 17a in the second embodiment is formed in a convex shape protruding toward an opening edge side (upper side in FIG. 14) of the opening 22. Also, the convex surface of the external connection electrode 17a is disposed to be exposed at the bottom of the opening 22.

The above-configured external connection electrode 17a can be obtained by the following manufacturing method. That is, when the multilayered wiring section 11 is formed on the second surface of the semiconductor device layer 7, as depicted in FIG. 15A, the third interlayer insulating film 16 is formed first, and then a concave portion 16a is formed in a portion of the third interlayer insulating film 16. The concave portion 16a is formed correspondingly to a position where the external connection electrode 17a is formed in a subsequent process by partially concaving the third interlayer insulating film 16 in a concave shape by etching. The concave portion 16a is formed in a region smaller than a region where the external connection electrode 17a is formed.

Next, as depicted in FIG. 15B, the third wiring layer 17 is formed on the third interlayer insulating film 16. At this time, the external connection electrode 17a formed as a part of the third wiring layer 17 is formed along the concave shape of the concave portion 16a described above. Subsequently, a manufacturing process similar to that in the first embodiment described above is performed to manufacture a solid-state imaging device.

In the solid-state imaging device 1 obtained through the manufacturing method described above, the external connection electrode 17a is formed in a convex shape protruding toward a semiconductor device layer 7 side. Therefore, with the opening 22 formed as described above, the external connection electrode 17a has a convex shape protruding toward the opening edge of the opening 22. In the above-configured solid-state imaging device, the surface of the external connection electrode 17a exposed at the bottom of the opening 22 is disposed closer to the opening edge of the opening 22 (at a shallower position), compared with the electrode structure adopted in the first embodiment described above (the structure in which the external connection electrode 17a is flat). Therefore, compared with the first embodiment described above, the tip of the capillary 36 is less prone to making contact with the edge of the opening 22.

3. Third Embodiment

Figure 17A:
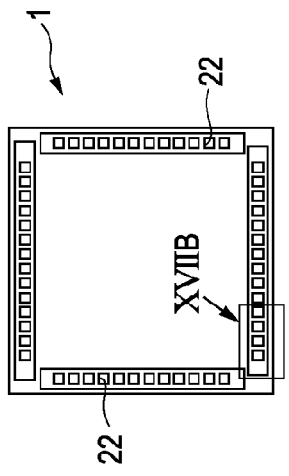
FIGS. 17A to 17C depict a dimensional example of the solid-state imaging device according to the third embodiment of the present invention.
Figure 17B:
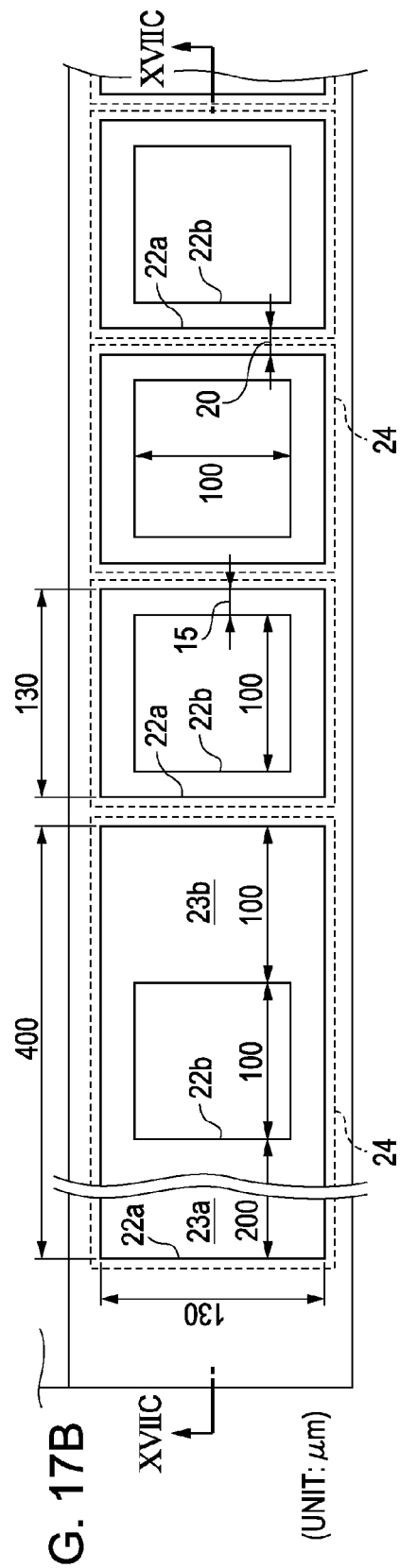
Figure 17C:
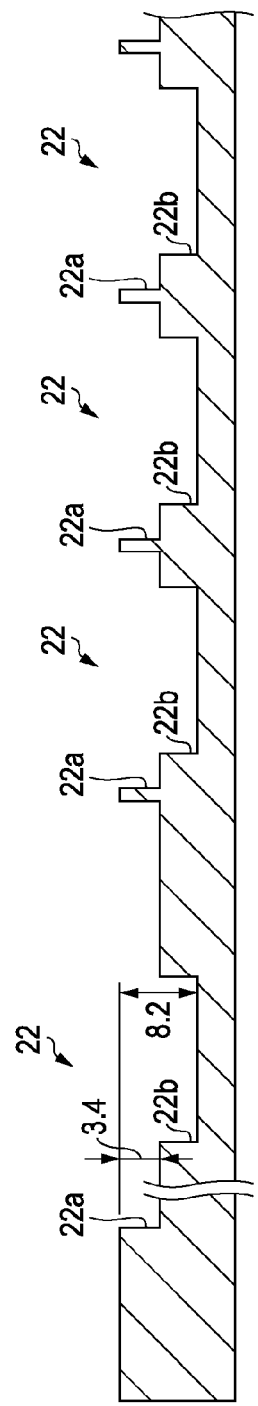

FIG. 16 is a section view of main parts of the structure of a solid-state imaging device according to a third embodiment of the present invention. In the solid-state imaging device 1 depicted in the drawing, in particular, the structure of the opening 22 is different from that of the first embodiment. That is, while the first opening 22a and the second opening 22b are each formed in a rectangular shape having a common center in the first embodiment described above, the first opening 22a of at least one opening 22 is formed so as to be partially enlarged in the third embodiment. Therefore, on a right side in a horizontal direction in FIG. 16, a distance from the edge of the second opening 22b to the edge of the first opening 22a is L1, while a distance from the edge of the second opening 22b to the edge of the first opening 22a is L2, which is longer than L1. For example, as depicted in FIGS. 17A to 17C, when a plurality of openings 22 are arranged with a predetermined spacing on the outer perimeter of the solid-state imaging device 1, the structure described above is applied only to the openings 22 disposed at four corners (tip ends). In such cases, the openings 22 disposed at the respective corners have a different size of the first opening 22a from the size of the first opening 22a of the other openings 22. That is, the opening 22 disposed at each corner has the first opening 22a formed larger than that of the other openings 22.

Examples of specific dimensions are now described. First, as for all of the openings 22, the openings 22 adjacent to each other in an arranging direction are spaced 20 μm apart from each other, and the second opening 22b is formed in a square shape measuring 100 μm per side. By contrast, in the opening 22 at each corner (tip end), the first opening 22a is formed in a rectangular shape with a long side of 400 μm and a short side of 130 μm. In the other openings 22, the first opening 22a is formed in a square shape measuring 130 μm per side. As for all of the openings 22, the first opening 22a is formed to have a depth of 3.4 μm, and the second opening 22b is formed to have a depth of 8.2 μm. Also, as for the opening 22 at each corner, in the direction of arrangement of the openings 22, a step 23a having a length of 200 μm is provided on one side (left side in FIG. 17B), and a step 23b having a length of 100 μm is provided on the other side (right side in FIG. 17B). The one step 23a forms an area into which a measuring tool is inserted for measuring a bonding strength of a conductor to be bonded to the external connection electrode 17a, in correspondence with the size of the measuring tool. The other step 23b forms a relief area for avoiding a contact with the conductor when the bonding strength of the conductor is measured with the measuring tool. Note herein that a ball (having a ball diameter of approximately 90 μm and a ball height of approximately 15 μm) of a wire, such as a gold wire, for use in wire bonding is assumed to be a conductor to be bonded to the external connection electrode 17a. However, the embodiment of the present invention is not meant to be restrictive.

Alternatively, for example, a metal bump may be bonded to the external connection electrode 17a as a conductor.

Figure 18:
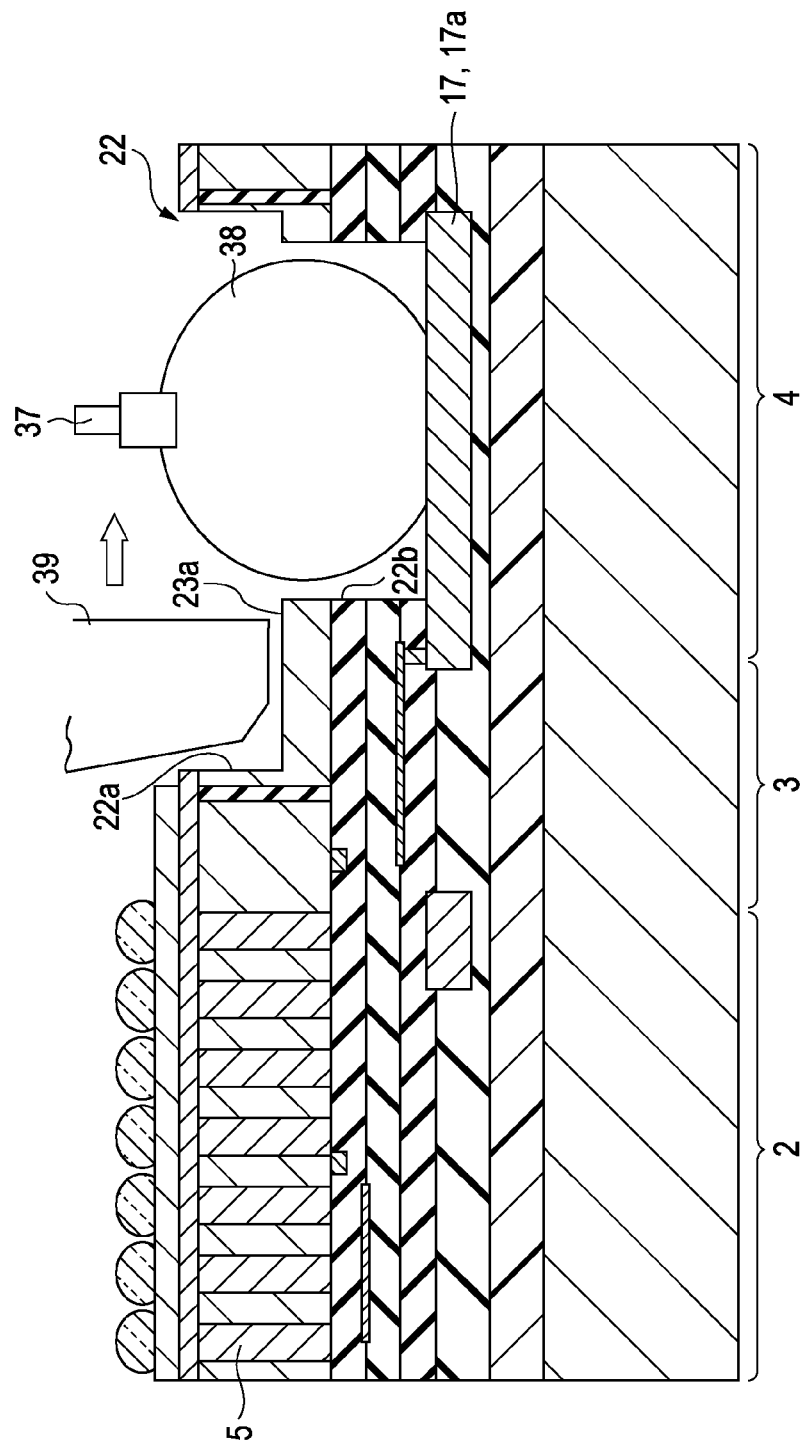
FIG. 18 is a diagram depicting the state of arrangement of the solid-state imaging device according to the third embodiment of the present invention and a measuring tool.

In the solid-state imaging device 1 according to the third embodiment of the present invention, when wire bonding is performed on the external connection electrode 17a exposed at the bottom of the opening 22 and then the bonding strength of the wire is measured, the tool inserting area provided by the step 23a described above is used. That is, as depicted in FIG. 18, the tip of a measuring tool 39 is disposed so as to be inserted into a concave portion with the step 23a of the first opening 22a, and then the measuring tool 39 is moved in a direction toward the ball 38 (direction indicated by an arrow). With this, the measuring tool 39 can be moved toward the inside of the opening 22 for disposition, compared with the case in which the step 23a allowing insertion of the measuring tool 39 is not provided. Therefore, when the measuring tool 39 is moved as described above, the measuring tool 39 can be made contact with a position close to the center of the ball 38 in a height direction of the ball 38. Therefore, the bonding strength (shearing strength) of the ball 38 can be appropriately measured by using the measuring tool 39. Incidentally, when the step 23a allowing insertion of the measuring tool 39 is not provided, as depicted in FIG. 19, when the measuring tool 39 is moved in a direction toward the ball 38, the measuring tool 39 makes contact with a position significantly shifted from the center of the ball 38. This makes it difficult to appropriately measure the bonding strength (shearing strength) of the ball 38 by using the measuring tool 39.

In the embodiments described above, the opening 22 having the step 23 provided at the boundary between the first opening 22a and the second opening 22b is exemplarily described. This is not meant to be restrictive. Alternatively, the opening 22 may be formed in a conical shape to prevent a contact with the capillary.

The embodiments of the present invention can be widely applied to solid-state imaging devices, such as CMOS image sensors and CCD image sensors, general semiconductor devices having a portion (functional section) for achieving a main function of the device formed on the semiconductor surface, and further general semiconductor devices provided with these semiconductor devices. For example, the embodiments of the present invention can also be applied to semiconductor integrated circuit devices, such as microprocessors and ASIC devices.

The present application contains subject matter related to that disclosed in Japanese Priority Patent Application JP 2008-279473 filed in the Japan Patent Office on Oct. 30, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
   a semiconductor device layer having at least one semiconductor device therein;
   a multilayered wiring section formed of a plurality of wiring layers and a plurality of interlayer insulating films;
   an external connection electrode formed on one of the plurality of wiring layers; and
   an opening formed in a concave shape extending from and through the semiconductor device layer and through a portion of the multilayered wiring section between the semiconductor device layer and the external connection electrode so as to expose a surface of the external connection electrode,
   wherein,
     the opening has a larger opening diameter at an end farther from the external connection electrode than at another end closer to the external connection electrode,
     an insulating layer surrounding an outside of the opening is formed inside of the semiconductor device layer so that the insulating layer does not cover side surfaces of the opening, and
     the insulating layer is disposed within trenches penetrating through the semiconductor device layer in a thickness direction of the semiconductor device layer.

2. The semiconductor device according to claim 1, wherein:
   the opening includes a first opening formed farther from the external connection electrode to have a first opening diameter and a second opening formed closer to the external connection electrode to have a second opening diameter smaller than the first opening diameter; and
   a boundary between the first opening and the second opening defines a step.

3. The semiconductor device according to claim 2, wherein the step is provided on a side of the semiconductor device layer.

4. The semiconductor device according to claim 1 or 2, wherein the external connection electrode is formed in a convex shape protruding toward an opening edge side of the opening.

5. The semiconductor device according to claim 2, wherein:
   a plurality of openings are formed; and
   at least one of the plurality of openings has the first opening larger than the first openings of other openings, in correspondence with a size of a measuring tool that measures a bonding strength of a conductor bonded to the external connection electrode.

6. The semiconductor device according to claim 1 or 2, wherein a guard ring is formed inside of the multilayered wiring section so as to surround an outside of the opening.

* * * * *